(12) United States Patent
Freiburger et al.

(10) Patent No.: US 9,087,563 B2
(45) Date of Patent: Jul. 21, 2015

(54) SRAM LOCAL EVALUATION AND WRITE LOGIC FOR COLUMN SELECTION

(75) Inventors: Peter T. Freiburger, Rochester, MN (US); Travis R. Hebig, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 129 days.

(21) Appl. No.: 13/604,800

(22) Filed: Sep. 6, 2012

(65) Prior Publication Data

US 2014/0063986 A1 Mar. 6, 2014

(51) Int. Cl.
*G11C 7/06* (2006.01)
*G06F 17/50* (2006.01)
*G11C 7/10* (2006.01)
*G11C 11/419* (2006.01)

(52) U.S. Cl.
CPC .......... *G11C 7/1096* (2013.01); *G11C 11/419* (2013.01)

(58) Field of Classification Search
CPC ....... G11C 11/419; G11C 7/08; G11C 7/1096
USPC .......... 365/189.14, 189.15, 189.16, 190, 205, 365/208, 156, 154, 203; 716/129, 130, 131, 716/126, 100
See application file for complete search history.

(56) References Cited

U.S. PATENT DOCUMENTS

| | | | |
|---|---|---|---|
| 6,209,123 B1 | 3/2001 | Maziasz et al. | |
| 6,522,565 B2 | 2/2003 | Shimazaki et al. | |
| 6,657,886 B1* | 12/2003 | Adams et al. | 365/154 |
| 7,102,944 B1 | 9/2006 | Bunce et al. | |
| 7,505,340 B1 | 3/2009 | Adams et al. | |
| 7,701,801 B2 | 4/2010 | Joshi et al. | |
| 7,715,221 B2* | 5/2010 | Christensen et al. | 365/154 |
| 7,724,585 B2 | 5/2010 | Behrends et al. | |
| 7,724,586 B2 | 5/2010 | Adams et al. | |
| 2008/0298137 A1 | 12/2008 | Chan et al. | |
| 2011/0292748 A1 | 12/2011 | Adams et al. | |
| 2014/0063916 A1* | 3/2014 | Freiburger et al. | 365/154 |

OTHER PUBLICATIONS

Chang et al., "An 8T-SRAM for Variability Tolerance and Low-Voltage Operation in High-Performance Caches", IEEE Journal of Solid-State Circuits, pp. 956-963, vol. 43, No. 4, Apr. 2008.
Joshi et al., "A High Performance 2.4 Mb L1 and L2 Cache Compatible 45nm SRAM with Yield Improvement Capabilities", 2008 Symposium on VLSI Circuits Digest of Technical Papers, pp. 208-209, © 2008 IEEE.
Park et al., "Column-Selection-Enabled 8T SRAM Array with ~IR/IW Multi-Port Operation for DVFS-Enabled Processors", 2011 International Symposium on Low Power Electronics and Design (ISLPED), Aug. 1-3, 2011, pp. 303-308.
U.S. Appl. No. 13/598,787, "SRAM Local Evaluation for Column Selection", Freiburger et al., filed Aug. 30, 2012.

\* cited by examiner

*Primary Examiner* — Andrew Q Tran
(74) *Attorney, Agent, or Firm* — Wood, Herron & Evans, LLP; Robert R. Williams

(57) ABSTRACT

An SRAM includes a first SRAM column having first SRAM cells and a first local evaluation logic coupled to a global bit line and a second SRAM column having second SRAM cells and a second local evaluation logic coupled to the same global bit line. The first SRAM column is selected with a first write line and the second SRAM column is selected with a second write line.

4 Claims, 7 Drawing Sheets

FIG. 1 – Prior Art

| 602 Read | 603 Data | 601A CSA | 601B CSB | 204A WTA | 204B WTB | 604A WCA | 604B WCB |
|---|---|---|---|---|---|---|---|
| 1 | Y | 1 | 0 | 1 | 0 | Y' | 0 |
| 1 | Y | 0 | 1 | 0 | 1 | 0 | Y' |
| 0 | Y | 1 | 0 | Y | 0 | Y' | 0 |
| 0 | Y | 0 | 1 | 0 | Y | 0 | Y' |

_US 9,087,563 B2_

SRAM LOCAL EVALUATION AND WRITE LOGIC FOR COLUMN SELECTION

TECHNICAL FIELD

The present disclosure relates to a column selection in a static random-access memory (SRAM). In particular, an SRAM column selection using write circuitry and a shared global bit line is described.

BACKGROUND

SRAMs may be arranged in a domino-logic structure using a local bit line coupled to a number of SRAM cells and a global bit line that may be discharged when the local bit line is discharged. The bit lines in a domino SRAM are precharged high and may be discharged to ground, or "pulled down." SRAM cells are connected in parallel to a read/write/precharge circuit through the local bit lines to form a column. The local bit lines are precharged by the read/write/precharge circuit and discharged by the selected cell during a read operation. A local bit line is coupled to a transistor which may discharge the global bit line. For multiple columns there is typically one global bit line per column. The global bit lines feed into a multiplexer, which receives a column address signal and selects the appropriate global bit line for the column selected. In order for the circuit to function, the global bit line must be precharged.

FIG. 1 is a schematic representation of a portion of a prior art SRAM circuit 100 having two columns 103A and 103B, a column A global bit line (GBL_A) 111A, and column B global bit line (GBL_B) 111B, and a multiplexer 113. SRAM cells 101 are connected to a read/write/precharge circuit 102 through a local bit line true (LBLT) 105 and a local bit line complement (LBLC) 104. LBLT 105 and LBLC 104 are precharged by a local bit line precharge line (LBL_PCH) 110 and transistors 1P1 and 1P2. A write true line (WT) 107 and its associated transistors 1N4 and 1N5, a write complement line (WC) 108 and its associated transistors 1N3 and 1N6, and a write enable line (WE) 109 and its associated transistor 1N7 control the write operations of a cell 101. GBL_A 111A and GBL_B 111B are precharged by a global bit line precharge line (GBL_PCH) 115 and transistors 1P3 and 1P4.

As an illustration, to read a "zero" from a cell 101 in column A 103A, a word line (WL) 106 turns on pass transistors 1N1 and 1N2. When the "zero" is read, LBLT 105 is pulled down while LBLC 104 remains high. The value on LBLT is inverted to a "one" by an inverter 116 and turns on a transistor 1N8, which pulls down the precharged GBL_A 111A. A column address select (CAS) 112 controls the multiplexer 113, which selects a global bit line to output to a data out line (Data_Out) 114. CAS 112 selects GBL_A 111A, and the "zero" outputs to Data_Out 114. GBL_A 111A is subsequently precharged for a next operation. This read operation requires one global bit line per column, each requiring precharging.

SUMMARY

In an embodiment of the invention, an SRAM includes a first SRAM column having first cells and a first local evaluation logic coupled to a global bit line and a second SRAM column having second cells and a second local evaluation logic coupled to the same global bit line. The first SRAM column is selected with a first write line and the second SRAM column is selected with a second write line.

In another embodiment of the invention, a method for sharing a global bit line between a first column and a second column includes selecting the first column with a first write line at a first time to drive the global bit line and selecting the second column with a second write line at a second time to drive the global bit line.

In another embodiment of the invention, a design structure tangibly embodied in a machine-readable storage medium is used in a design process of an SRAM. The design structure has elements that, when processed in a semiconductor manufacturing facility, produce an SRAM. The SRAM includes a first SRAM column having first SRAM cells and a first local evaluation logic coupled to a global bit line, and a second SRAM column having second SRAM cells and a second local evaluation logic coupled to the global bit line. The first SRAM column is selected with a first write line and the second SRAM column is selected with a second write line.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

DETAILED DESCRIPTION

According to embodiments of the invention, an SRAM column selection may be performed through local evaluation logic in a column to select the column to drive a shared global bit line. An SRAM column may contain local evaluation logic and one or more SRAM cells, each cell storing a "one" or a "zero." The SRAM column may be coupled to a global bit line through a global discharge line. More than two columns may be connected to a single global bit line, but two columns will be referenced herein for exemplary purposes. The local evaluation logic may be coupled to a write line. During a write operation, the write line may be used to write data to a cell as in a normal write operation. During a read operation, the write line may enable the selected column to discharge the global bit line through the local evaluation logic and the global bit line discharge line. One column connected to the global bit line may be selected at a time.

Power and space conservation and reduction are becoming increasingly important as circuit technology advances. Precharging multiple bit lines requires energy and resources. Decreasing wiring congestion and power consumption may enable higher density chips with less power consumption. Utilizing a write line with a common global bit line eliminates a need for a separate global bit line per column and a separate column select signal to the SRAM column for read operations. By reducing the number of global bit lines, the energy required to precharge the global bit lines is reduced. Additionally, the global bit line may not be discharged during a write operation.

Figure 1:
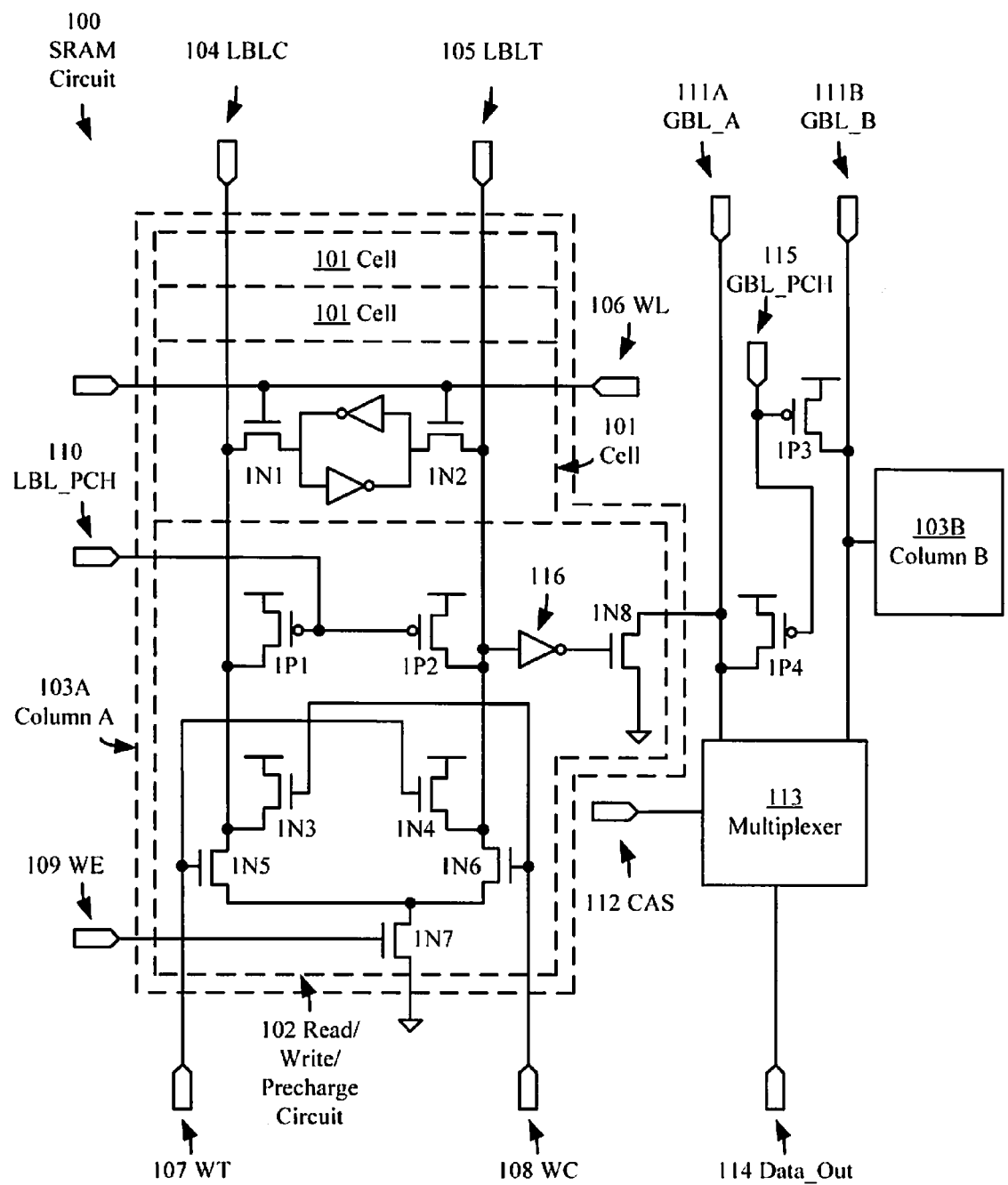
FIG. 1 is a schematic representation of a portion of a prior art SRAM circuit having one global bit line per column, where the desired column is selected with a multiplexer.
Figure 2:
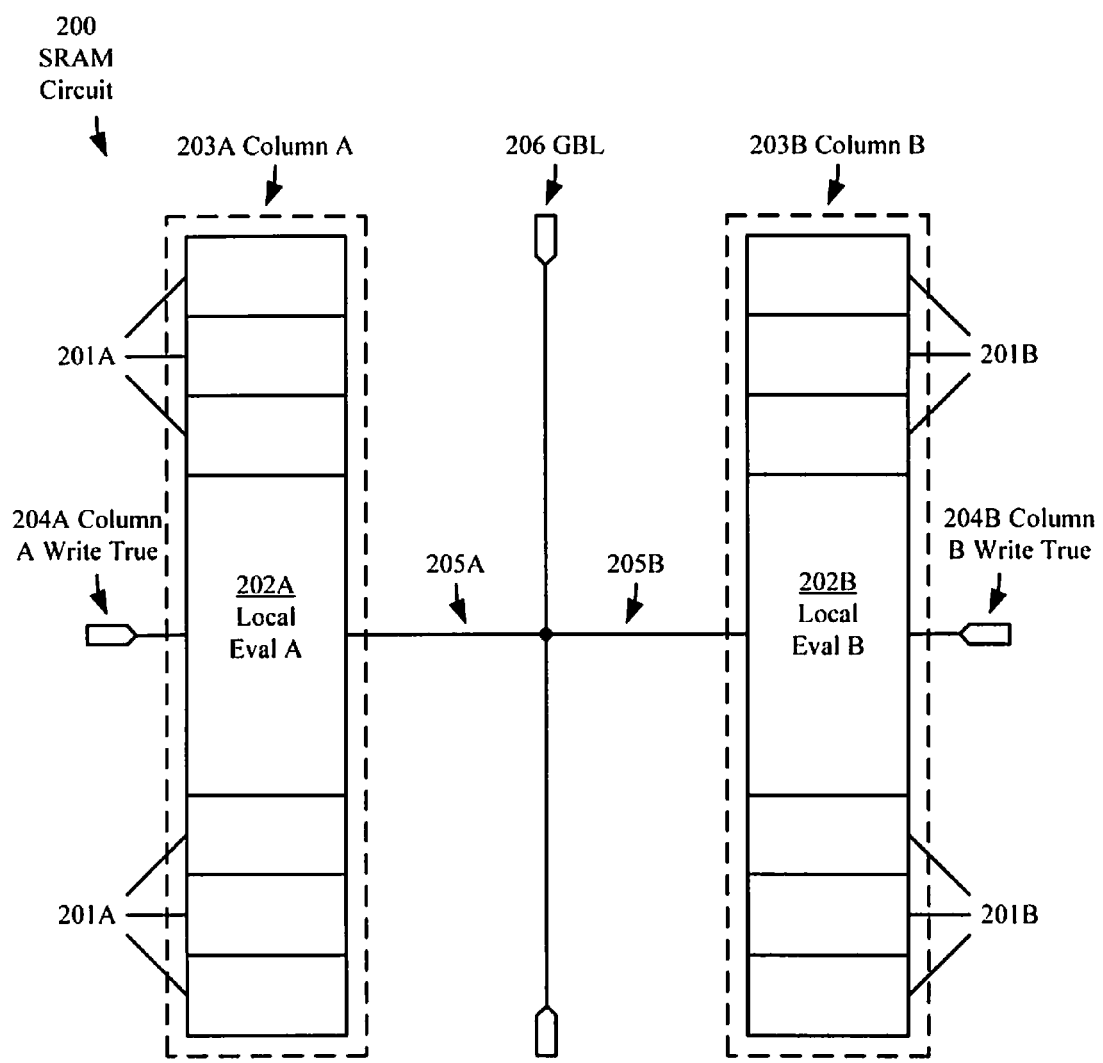
FIG. 2 is a diagrammatic representation of a portion of an SRAM circuit having a write line in a local evaluation logic and two columns sharing a global bit line, according to embodiments of the invention.

FIG. 2 is a diagrammatic representation of a portion of an SRAM circuit having a write true line coupled to local evaluation logic and two columns sharing a global bit line, according to embodiments of the invention. It will be understood that letters A and B have been appended to items to clearly reference a "left" item (e.g., column A 203A) or a "right" item (e.g., column B 203B) for purposes of explanation only. Such items may be generically referenced as "column 203." Similarly, the terms "true" and "complement" are used only to distinguish two similar but inversely operable lines.

An SRAM circuit 200 may contain two or more columns 203 which share a single global bit line 206, wherein letters A and B are used to identify items in columns 203A and 203B. A column 203 may have a plurality of groups of SRAM cells 201 and local evaluation logic 202. A global bit line discharge line 205 may couple the local evaluation logic 202 to the global bit line 206. If a cell 201 is read, a write true line 204 communicates with the local evaluation logic 202 to select the column 203. The write true line 204 enables the selected global bit line discharge 205 and local evaluation logic 202 to pull down the global bit line 206 during a read of the data on the selected SRAM cell.

In embodiments of the invention, SRAM column selection may be carried out through a column selection operation in which the local evaluation logic may use switches, such as a field effect transistor, operated by a write line. The write line and an associated switch act as a gate between a global bit line and ground. So long as there is no discharge path for the global bit line, the global bit line may not be pulled down. Once the write line enables a discharge path for the global bit line, the global bit line may be discharged by a column's global bit line discharge transistor. The global bit line discharge transistor may have a gate operated by a local bit line.

Figure 3:
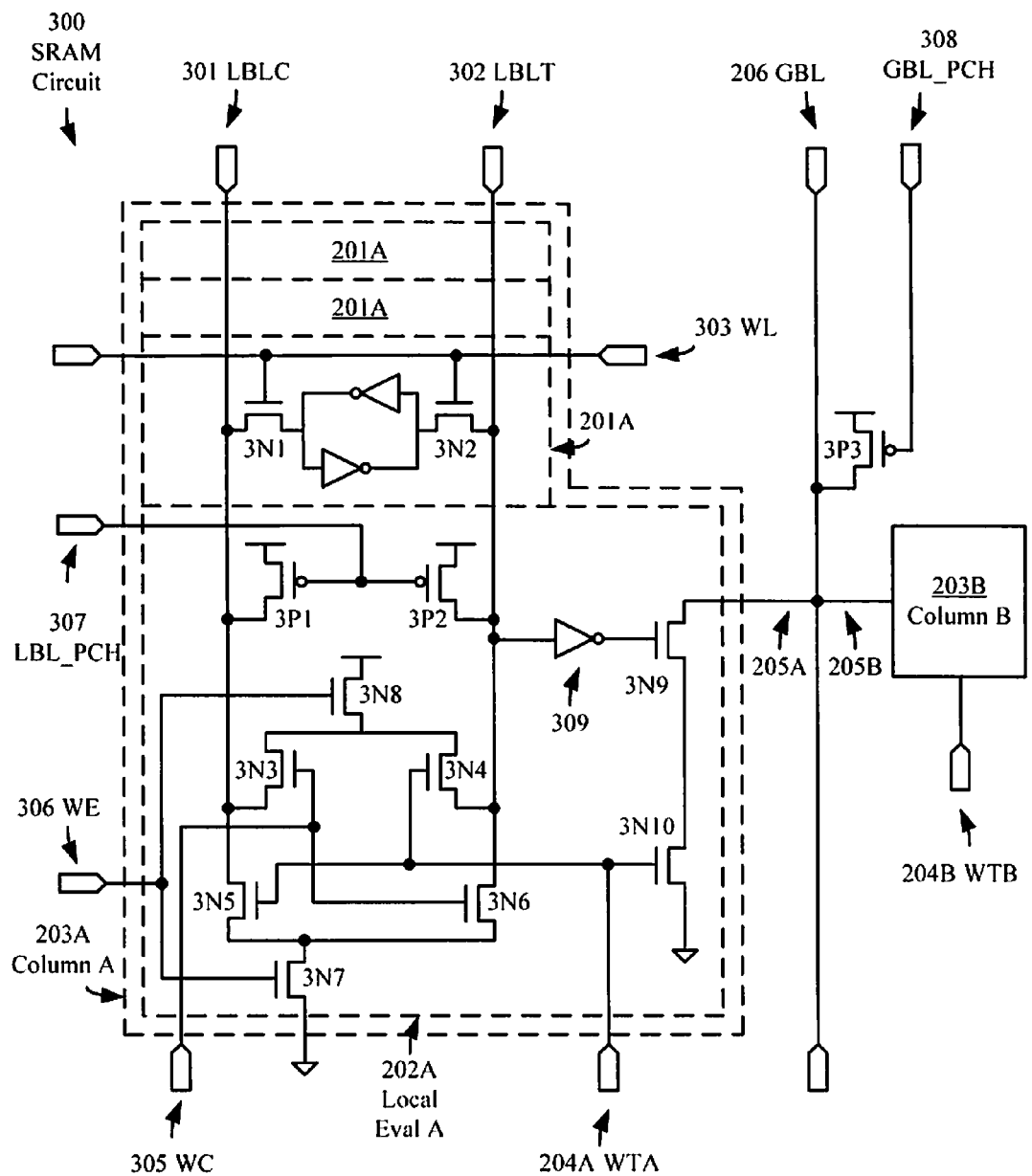
FIG. 3 is a schematic representation of a portion of an SRAM circuit having a write true line to enable a local evaluation logic to drive a shared global bit line, according to an embodiment of the invention.

FIG. 3 is a schematic representation of a portion of an SRAM circuit 300 having a write true line 204 to enable local evaluation logic 202 to drive a shared global bit line 206, according to an embodiment of the invention. A local bit line true (LBLT) 302 and a local bit line complement (LBLC) 301 are precharged by a local bit line precharge line (LBL_PCH) 307 and transistors 3P1 and 3P2. A column A write true line (WTA) 204A and its associated transistors 3N4, 3N5 and 3N10, a write complement line (WC) 304 and its associated transistors 3N3 and 3N6, and a write enable line (WE) 306 and its associated transistor 3N7 control the read and write operations of a cell 201A. A global bit line (GBL) 206 is precharged by a global bit line precharge line (GBL_PCH) 308 and a transistor 3P3.

As an illustration, to read a "zero" from a cell 201A in column A 203A, a word line (WL) 303 turns on pass transistors 3N1 and 3N2. The LBLT 302 is pulled down, as a zero is stored on the right node of the cell, while LBLC 301 remains high. LBLT 302 is coupled through an inverter 309 to a global bit line discharge transistor 3N9. The low on the input to inverter 309 causes it to output high, which turns on the global bit line discharge transistor 3N9. WTA 204A turns on a column select transistor 3N10, whose source is coupled to ground and drain is coupled to the source of the global bit line discharge transistor 3N9. With 3N9 and 3N10 turned on, a discharge path is provided through a global bit line discharge line 205A for the precharged GBL 206 to be pulled down, outputting the "zero" stored in a cell 101A on the GBL 206. A column B write true line (WTB) 204B may be low during the column select operation for column A 203A. A global bit line discharge line 205B for column B 203B may pull down the global bit line 206 when column B is selected by 204B. A stored "one" may be read in a similar operation as described above.

Figure 4:
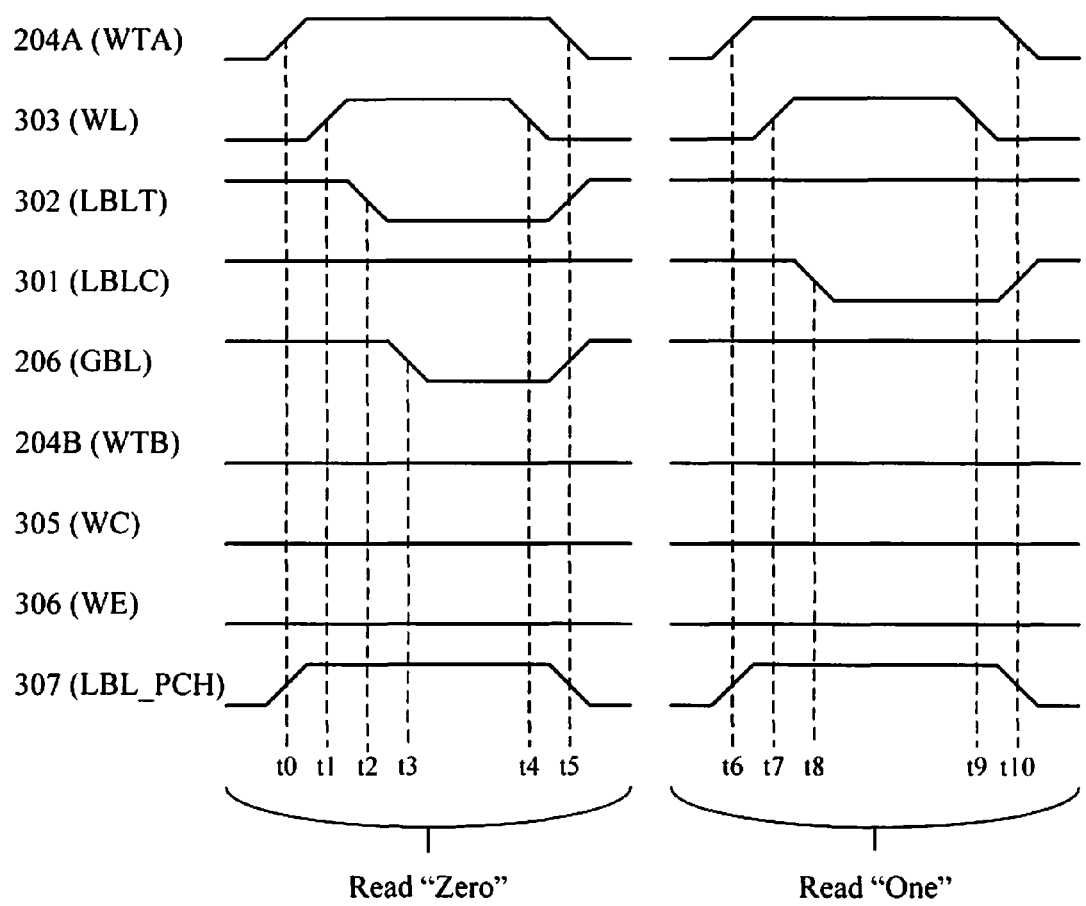
FIG. 4 is a timing diagram of a read operation of an SRAM cell having a "zero" value and a read operation of an SRAM cell having a "one" value, according to embodiments of the invention.

FIG. 4 is a timing diagram of a read operation of an SRAM cell having a "zero" value and an SRAM cell having a "one" value, according to embodiments of the invention. For reading a "zero" from a cell, at t0, a column A write true line (WTA) 204A and a local bit line precharge line (LBL_PCH) 307 go high. A word line (WL) 303 for the cell goes high at t1, turning on the cell's pass transistors. A "zero" is stored in the cell, and brings down a local bit line true (LBLT) 302 at t2 while a local bit line complement (LBLC) 301 remains precharged high. At t3 a global bit line (GBL) 206 is pulled down. Once GBL 206 is sampled, the WL 303 goes low at t4, turning off the cell's pass transistors. At t5 the LBLT 302 and the GBL 206 return to a precharged high, and the WTA 204A and LBL_PCH 307 may return low. A column B write true line (WTB) 204B, a write complement line (WC) 305, and a write enable line (WE) 306 may stay low for the read operation.

For reading a "one" from a cell in column A, at t6, WTA 204A and LBL_PCH 307 may go high. WL 303 for the cell goes high at t7, turning on the cell's pass transistors. A "one" is stored in the cell, and brings down LBLC 301 at t8 while LBLT 302 remains precharged high and GBL 206 is not discharged. Once GBL 206 is sampled, WL 303 goes low at t9, closing the cell's pass transistors. At t10 LBLC 301 returns to a precharged high, and WTA 204A and LBL_PCH 307 may return low. GBL 206 and LBLT 302 may remain high for the read operation. WTB 204B, WC 305, and WE 306 may remain low for the read operation.

Figure 5:
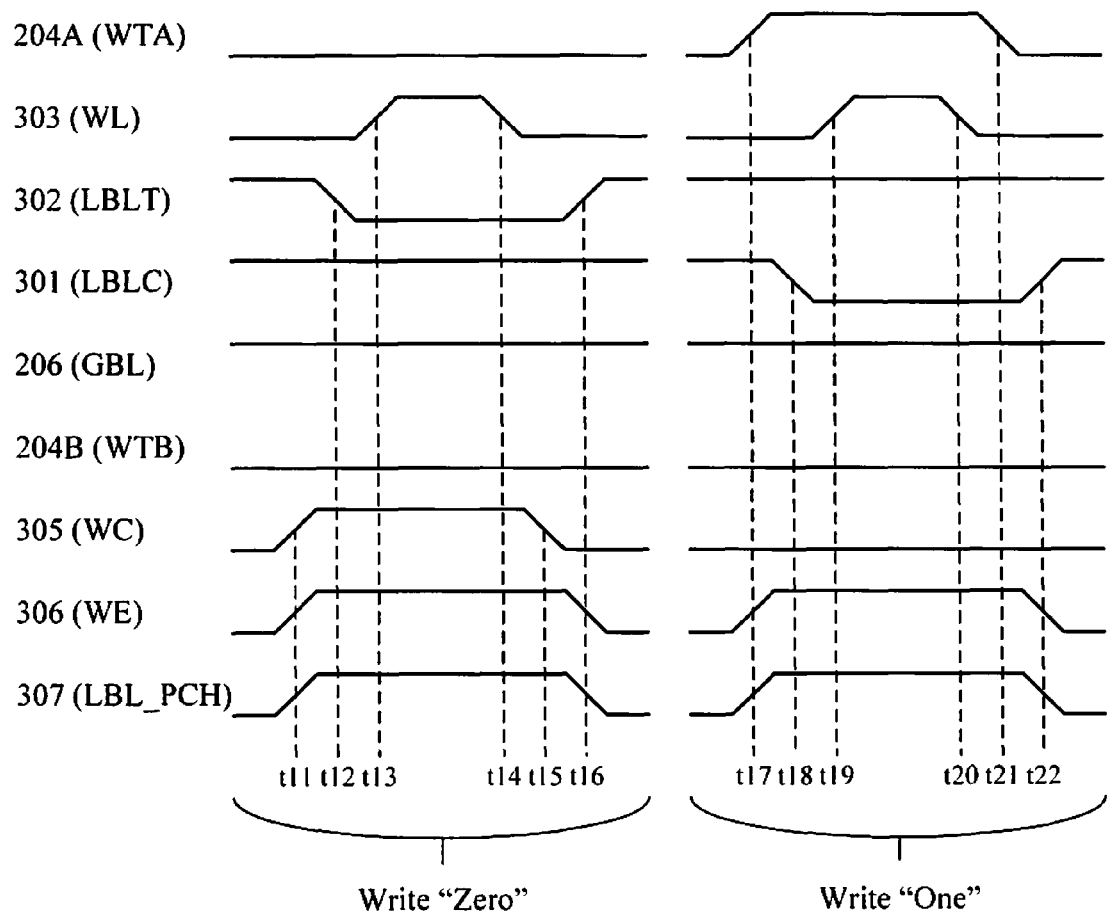
FIG. 5 is a timing diagram of a write operation of an SRAM cell to a "zero" value and a write operation of an SRAM cell to a "one" value, according to embodiments of the invention.

FIG. 5 is a timing diagram of a write operation of an SRAM cell to a "zero" value and a write operation of an SRAM cell to a "one" value, according to embodiments of the invention. For writing a "zero" to a cell in column A, at t11, a write enable line (WE) 306, a write complement line (WC) 305, and a local bit line precharge line (LBL_PCH) 307 may go high, bringing down a local bit line true (LBLT) 302 at t12 while a local bit line complement (LBLC) 301 remains high. A word line (WL) 303 for the cell goes high at t13, turning on the cell's pass transistors. A "one" is stored in the cell and WL 303 returns to low at t14. WC 305 returns to low at t15, followed by LBLT 302 returning to a precharged high at t16 while WE 306 and LBL_PCH 307 go low. A "one" may be written in a similar operation.

In embodiments of the invention, an SRAM column may contain local evaluation logic that includes read/write logic to operate a write line for read and write operations. During a write operation, the write line may be used to write data to a cell of a selected column through the operation of a data line and a column select line. During a read operation, the write line may enable the selected column to discharge the global bit line through the operation of a read line and the column select line. In embodiments of the invention, the read/write logic discussed above is carried out by switches, such as field effect transistors.

Figures 6A, 6B:
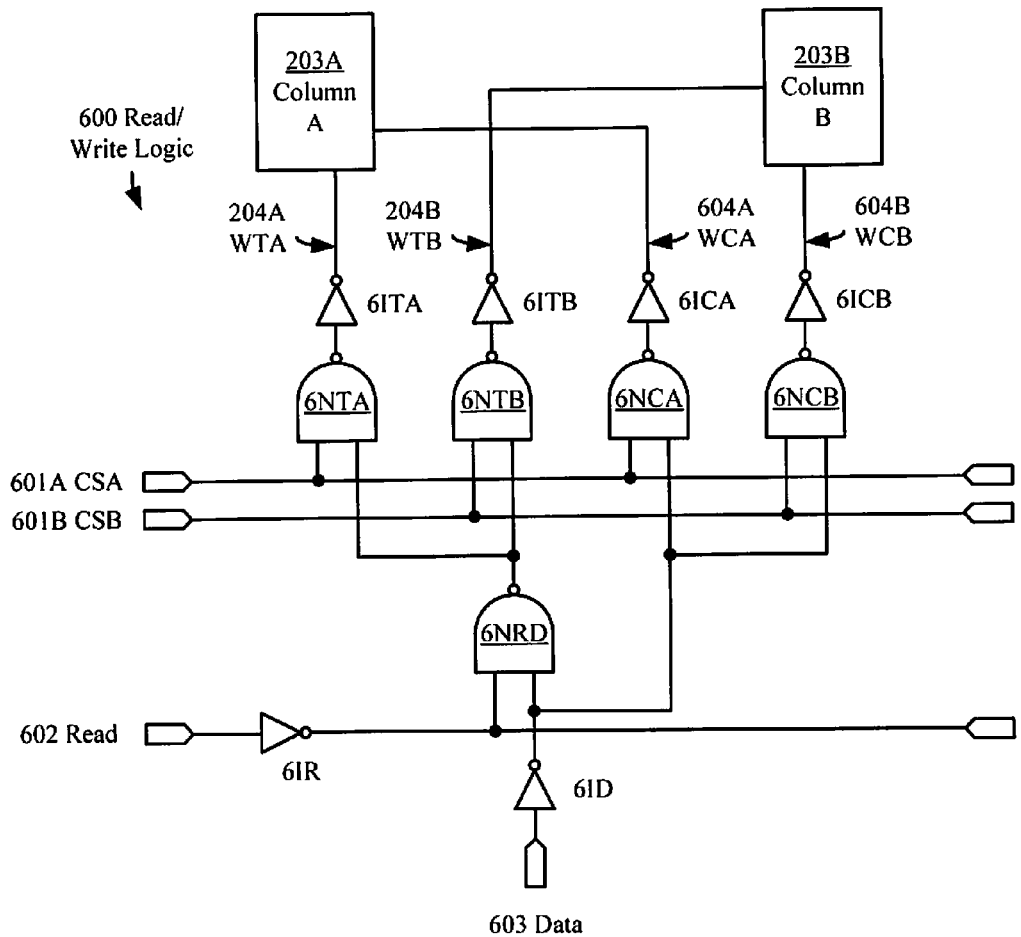
FIG. 6A is a schematic representation of a read/write logic for controlling column selection for read operations and write values for write operations, according to embodiments of the invention.
FIG. 6B is a logic table of the schematic of FIG. 6A, according to embodiments of the invention.

FIG. 6A is a schematic representation of a read/write logic 600 for controlling column selection for read operations and cell values for write operations, according to embodiments of the invention. For example, to read a "zero" from a cell in column A, a "one" is transmitted on a read line (Read) 602. The "one" is inverted by a read inverter 61R to a "zero," which outputs to a read/data NAND gate 6NRD. 6NRD outputs a "one" to a column A write true NAND gate 6NTA and a column B write true NAND gate 6NTB. A column A select line (CSA) 601A transmits a "one" to 6NTA, while a column B select line (CSB) 601B transmits a "zero" to 6NTB. The "one" from the output of 6NRD and the "one" from the CSA 601A cause 6NTA to output a "zero," where the "zero" is subsequently inverted by a column A write true inverter 61TA to a "one" on a column A write true line (WTA) 204A. The "one" on the WTA 204A selects column A (203A) to control the discharge of a global bit line, thereby selecting column A (203A). The "one" from the output of 6NRD and the "zero" from the CSB 601B cause 6NTB to output a "one," where the "one" is subsequently inverted by a column B write true inverter 61TB to output a "zero" on a column B write true line 204B. A column A write complement line (WCA) 604A, a column B write complement line (WCB) 604B, and a data line (Data) 603 may not be involved in the read operation. A similar process is used to read a "one."

Still referring to FIG. 6A, to write a "one" to a cell in column A, a "zero" is transmitted on the Read 602. The "zero" is inverted by 61R to a "one," which inputs into 6NRD. A "one" is transmitted on Data 603. The "one" is inverted by a data inverter 61D to a "zero," which inputs to 6NRD, a column A write complement NAND gate 6NCA, and a column B write complement NAND gate 6NCB. 6NRD, having a "one" and a "zero" input, outputs a "one" to 6NTA and 6NTB. CSA 601A transmits a "one" to 6NTA and 6NCA, while CSB 601B transmits a "zero" to 6NTB and 6NCB. The two "one" inputs into 6NTA cause the gate to output a "zero," which is inverted to a "one" by 61TA and carried on WTA 204A. A "zero" input into 6NTB, 6NCA, and 6NCB cause each of those gates to output a "one," which is subsequently inverted to a "zero" by 61TA, 61CA, and 61CB, respectively, and carried onto WTB 204B, CWA 604B, and CWB 604B, respectively. A "one" on WTA 204A and a "zero" on WCA 604A transmit onto a local bit line true and a local bit line complement, respectively, which write a "one" to the selected cell when the cell's pass transistors are turned on by a word line.

FIG. 6B is a logic table of the schematic of FIG. 6A, according to embodiments of the invention, with letters A and B designating the column of the signal. The column select line 601 controls which column will be selected for a read or write. When the read line 602 goes high as in a read operation, the column select line 601 operates the corresponding write true line 204, which controls the column selection operation. When the read line 602 goes low as in a write operation, the data line 603 controls the value (Y) to be written to the selected column's write true line 204 and the value (Y') to be written to the selected column's write complement line 604.

Figure 7:
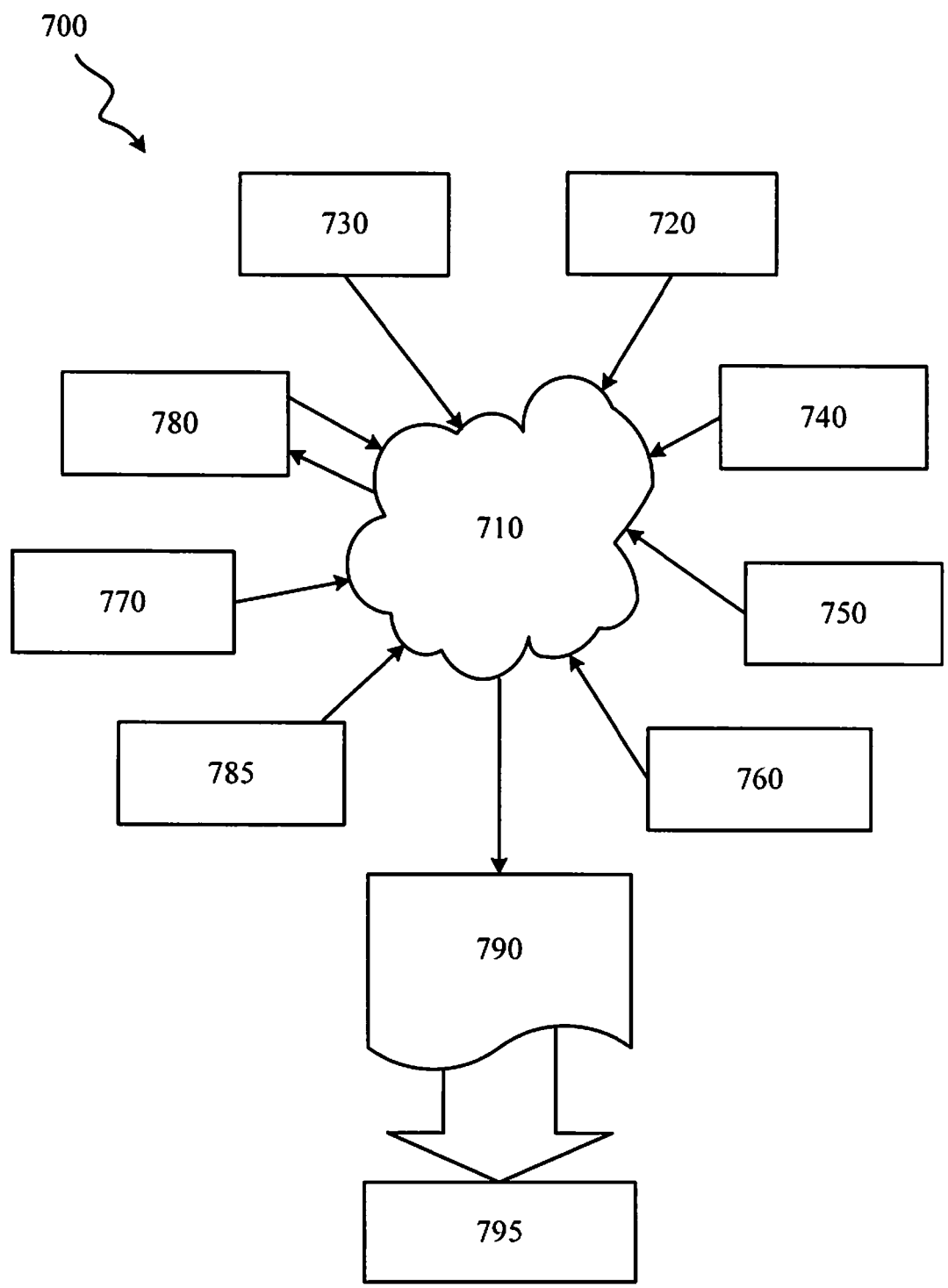
FIG. 7 is a flow diagram of a design process used in semiconductor design, manufacture, and/or test of the inventive SRAM depicted in FIG. 2, 3, 6A, according to embodiments of the invention.

FIG. 7 illustrates multiple design structures 700 including an input design structure 720 that is preferably processed by a design process. Design structure 720 may be a logical simulation design structure generated and processed by design process 710 to produce a logically equivalent functional representation of a hardware device. Design structure 720 may alternatively include data or program instructions that, when processed by design process 710, generate a functional representation of the physical structure of a hardware device. Whether representing functional or structural design features, design structure 720 may be generated using electronic computer-aided design, such as that implemented by a core developer/designer. When encoded on a machine-readable data transmission, gate array, or storage medium, design structure 720 may be accessed and processed by one or more hardware or software modules within design process 710 to simulate or otherwise functionally represent an electronic component, circuit, electronic or logic module, apparatus, device, or system such as those shown in FIGS. 2, 3, and 6A. As such, design structure 720 may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 710 preferably employs and incorporates hardware or software modules for synthesizing, translating, or otherwise processing a design/simulation functional equivalent of the components, circuits, devices, or logic structures shown in FIGS. 2, 3, and 6A to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describe the connections to other elements and circuits in an integrated circuit design. Netlist 780 may be synthesized using an iterative process in which Netlist 780 is resynthesized one or more times depending on design specifications and parameters for the device. As with other design structure types described herein, Netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710, without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures, along with any additional mechanical design or data, to generate a second design structure 790. Design structure 790 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 2, 3, and 6A. In one embodiment, design structure 790 may comprise a compiled, executable HDL simulation model that functionally simulates the devices shown in FIGS. 2, 3, and 6A.

Design structure 790 may also employ a data format used for the exchange of layout data of integrated circuits and/or symbolic data format (e.g., information stored in a GDSII, GL1, OASIS, map files, or any other suitable format for storing such design data structures). Design structure 790 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2, 3, 6A. Design structure 790 may then proceed to a state 795 where, for example, design structure 790 proceeds to tape-out, is released to manufacturing, is released to a mask house, is sent to another design house, is sent back to the customer, etc.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. An SRAM, comprising:
    a first SRAM column having first SRAM cells and a first local evaluation logic coupled to a global bit line, wherein the first SRAM column is selected with a first write line;
    a second SRAM column having second SRAM cells and a second local evaluation logic coupled to the global bit line, wherein the second SRAM column is selected with a second write liner; and
    a read/write logic configured to control column selection for read and write operations by operating the first write line and the second write line, the read/write logic receiving as inputs:
        a first column select line,
        a second column select line,
        a data line, and
        a read line configured to cause:
            a signal on the first column select line to be generated on the first write line and a signal on the second column select line to be generated on the second write line during a read operation, and
            a signal on the data line to be generated on one of the first write line or the second write line during a write operation according to the respective signals on the first and second column select lines.

2. The SRAM of claim 1, further comprising:
    a first local bit line coupled to the first SRAM cells and the global bit line; and
    a second local bit line coupled to the second SRAM cells and the global bit line.

3. The SRAM of claim 2, wherein:
    the first local evaluation logic further comprises a first switch operated by the first local bit line and coupled to the global bit line, and a second switch operated by the first write line and coupled to the first switch and a ground potential; and
    the second local evaluation logic further comprises a third switch operated by the second local bit line and coupled to the global bit line, and a fourth switch operated by the second write line and coupled to the third switch and the ground potential.

4. The SRAM of claim 3, wherein:
    the first switch is a first transistor having a drain coupled to the global bit line and a gate coupled to the first local bit line;
    the second switch is a second transistor having a source coupled to the ground potential, a drain coupled to the first transistor, and a gate coupled to the first write line;
    the third switch is a third transistor having a drain coupled to the global bit line and a gate coupled to the second local bit line; and
    the fourth switch is a fourth transistor having a source coupled to the ground potential, a drain coupled to the third transistor, and a gate coupled to the second write line.

* * * * *